(12) United States Patent
Brittain et al.

(10) Patent No.: US 7,930,469 B2
(45) Date of Patent: *Apr. 19, 2011

(54) SYSTEM TO PROVIDE MEMORY SYSTEM POWER REDUCTION WITHOUT REDUCING OVERALL MEMORY SYSTEM PERFORMANCE

(75) Inventors: Mark A. Brittain, Pflugerville, TX (US); Kevin C. Gower, LaGrangeville, NY (US); Warren E. Maule, Cedar Park, TX (US)

(73) Assignee: International Business Machines Corporation, Armonk, NY (US)

( * ) Notice: Subject to any disclaimer, the term of this patent is extended or adjusted under 35 U.S.C. 154(b) by 598 days.

This patent is subject to a terminal disclaimer.

(21) Appl. No.: 12/018,952

(22) Filed: Jan. 24, 2008

(65) Prior Publication Data
US 2009/0190429 A1 Jul. 30, 2009

(51) Int. Cl.
*G06F 12/00* (2006.01)
(52) U.S. Cl. .............. 711/105; 711/167; 711/E12.001; 713/324
(58) Field of Classification Search .................. None
See application file for complete search history.

(56) References Cited

U.S. PATENT DOCUMENTS

| | | |
|---|---|---|
| 5,367,643 A | 11/1994 | Chang et al. |
| 5,386,540 A | 1/1995 | Young et al. |
| 5,513,135 A | 4/1996 | Dell et al. |
| 5,598,113 A | 1/1997 | Jex et al. |
| 5,640,349 A | 6/1997 | Kakinuma et al. |
| 5,867,731 A | 2/1999 | Williams et al. |
| 5,887,272 A | 3/1999 | Sartore et al. |
| 5,896,404 A | 4/1999 | Kellogg et al. |
| 6,049,476 A | 4/2000 | Laudon et al. |
| 6,095,827 A | 8/2000 | Dutkowsky et al. |
| 6,109,929 A | 8/2000 | Jasper |
| 6,141,728 A | 10/2000 | Simionescu et al. |
| 6,263,448 B1 | 7/2001 | Tsern et al. |

(Continued)

FOREIGN PATENT DOCUMENTS
WO WO 99/49468 9/1999

OTHER PUBLICATIONS

U.S. Appl. No. 11/613,363, filed Dec. 20, 2006, Pham et al.

(Continued)

*Primary Examiner* — Kevin Verbrugge
(74) *Attorney, Agent, or Firm* — Franicis Lammes; Stephen J. Walder, Jr.; Diana R. Gerhardt

(57) ABSTRACT

A memory system is provided that provides memory system power reduction without reducing overall memory system performance. The memory system comprises a memory hub device integrated in a memory module. The memory hub device comprises a command queue that receives a memory access command from an memory controller via a memory channel at a first operating frequency. The memory system also comprises a memory hub controller integrated in the memory hub device. The memory hub controller reads the memory access command from the command queue at a second operating frequency. By receiving the memory access command at the first operating frequency and reading the memory access command at the second operating frequency an asynchronous boundary is implemented. Using the asynchronous boundary, the memory channel operates at a maximum designed operating bandwidth while the second operating frequency is independently decreased to reduce power being consumed by the set of memory devices.

20 Claims, 5 Drawing Sheets

U.S. PATENT DOCUMENTS

| | | | |
|---|---|---|---|
| 6,279,072 B1 | 8/2001 | Williams et al. |
| 6,285,622 B1 | 9/2001 | Haraguchi et al. |
| 6,356,500 B1 | 3/2002 | Cloud et al. |
| 6,397,287 B1 | 5/2002 | Brown et al. |
| 6,397,290 B1 | 5/2002 | Williams et al. |
| 6,401,149 B1 | 6/2002 | Dennin et al. |
| 6,415,349 B1 | 7/2002 | Hull et al. |
| 6,418,068 B1 | 7/2002 | Raynham |
| 6,477,614 B1 | 11/2002 | Leddige et al. |
| 6,507,887 B1 | 1/2003 | Pontius et al. |
| 6,512,644 B1 | 1/2003 | Hall et al. |
| 6,584,543 B2 | 6/2003 | Williams et al. |
| 6,683,372 B1 | 1/2004 | Wong et al. |
| 6,721,864 B2 | 4/2004 | Keskar et al. |
| 6,785,837 B1 | 8/2004 | Kilmer et al. |
| 6,789,169 B2 | 9/2004 | Jeddeloh |
| 6,821,144 B2 | 11/2004 | Choy |
| 6,822,960 B1 | 11/2004 | Manchester et al. |
| 6,848,060 B2 | 1/2005 | Cook et al. |
| 6,889,284 B1 | 5/2005 | Nizar et al. |
| 6,910,145 B2 | 6/2005 | MacLellan et al. |
| 6,938,119 B2 | 8/2005 | Kohn et al. |
| 6,952,745 B1 | 10/2005 | Dodd et al. |
| 6,961,281 B2 | 11/2005 | Wong et al. |
| 6,982,892 B2 | 1/2006 | Lee et al. |
| 7,043,611 B2 | 5/2006 | McClannahan et al. |
| 7,054,179 B2 | 5/2006 | Cogdill et al. |
| 7,103,730 B2 | 9/2006 | Saxena et al. |
| 7,111,143 B2 | 9/2006 | Walker |
| 7,114,117 B2 | 9/2006 | Tamura et al. |
| 7,117,328 B2 | 10/2006 | Shibuya et al. |
| 7,120,727 B2 | 10/2006 | Lee et al. |
| 7,124,332 B2 | 10/2006 | Constantinescu |
| 7,133,972 B2 | 11/2006 | Jeddeloh |
| 7,143,246 B2 | 11/2006 | Johns |
| 7,162,669 B2 | 1/2007 | Gross |
| 7,200,021 B2 | 4/2007 | Raghuram |
| 7,200,023 B2 | 4/2007 | Foster, Sr. |
| 7,203,874 B2 | 4/2007 | Roohparvar |
| 7,210,015 B2 | 4/2007 | Barth et al. |
| 7,216,196 B2 | 5/2007 | Jeddeloh |
| 7,225,303 B2 | 5/2007 | Choi |
| 7,234,099 B2 | 6/2007 | Gower et al. |
| 7,269,042 B2 | 9/2007 | Kinsley et al. |
| 7,272,070 B2 | 9/2007 | Hummler |
| 7,386,649 B2 | 6/2008 | Jeddeloh et al. |
| 7,490,209 B1 * | 2/2009 | Charagulla ............ 711/167 |
| 7,558,124 B2 | 7/2009 | Wu et al. |
| 7,558,887 B2 | 7/2009 | Gower et al. |
| 7,577,039 B2 | 8/2009 | Yang et al. |
| 7,584,308 B2 | 9/2009 | Gower et al. |
| 7,610,430 B2 | 10/2009 | Jeddeloh |
| 7,770,077 B2 | 8/2010 | Arimilli et al. |
| 7,774,559 B2 | 8/2010 | Cronin et al. |
| 7,788,451 B2 | 8/2010 | Larson et al. |
| 2002/0112119 A1 | 8/2002 | Halbert et al. |
| 2003/0037280 A1 | 2/2003 | Berg et al. |
| 2003/0061447 A1 | 3/2003 | Perego et al. |
| 2003/0097526 A1 | 5/2003 | Chiu et al. |
| 2003/0137862 A1 | 7/2003 | Brunelle et al. |
| 2004/0006674 A1 | 1/2004 | Hargis et al. |
| 2004/0024971 A1 | 2/2004 | Bogin et al. |
| 2004/0109468 A1 | 6/2004 | Anjanaiah |
| 2004/0117566 A1 | 6/2004 | McClannahan et al. |
| 2004/0128464 A1 | 7/2004 | Lee et al. |
| 2004/0213074 A1 | 10/2004 | Johnson et al. |
| 2004/0236877 A1 | 11/2004 | Burton |
| 2005/0033921 A1 | 2/2005 | Jeddeloh |
| 2005/0050255 A1 | 3/2005 | Jeddeloh et al. |
| 2005/0125702 A1 | 6/2005 | Huang et al. |
| 2005/0138267 A1 | 6/2005 | Bains et al. |
| 2005/0138302 A1 | 6/2005 | Lusk et al. |
| 2005/0160250 A1 | 7/2005 | Yoshimi |
| 2005/0216677 A1 | 9/2005 | Jeddeloh et al. |
| 2005/0223161 A1 | 10/2005 | Jeddeloh et al. |
| 2006/0095592 A1 | 5/2006 | Borkenhagen |
| 2006/0117322 A1 | 6/2006 | Gimness et al. |
| 2006/0123261 A1 | 6/2006 | Riley et al. |
| 2006/0158917 A1 | 7/2006 | Bartley et al. |
| 2006/0168407 A1 | 7/2006 | Stern |
| 2006/0179262 A1 | 8/2006 | Brittain et al. |
| 2006/0212775 A1 | 9/2006 | Cypher |
| 2006/0235901 A1 | 10/2006 | Chan |
| 2006/0245226 A1 | 11/2006 | Stewart |
| 2006/0271755 A1 | 11/2006 | Miura |
| 2006/0288132 A1 | 12/2006 | McCall et al. |
| 2007/0005922 A1 | 1/2007 | Swaminathan et al. |
| 2007/0011392 A1 | 1/2007 | Lee et al. |
| 2007/0011562 A1 | 1/2007 | Alexander et al. |
| 2007/0016718 A1 | 1/2007 | Radhakrishnan et al. |
| 2007/0033317 A1 | 2/2007 | Jeddeloh et al. |
| 2007/0050530 A1 | 3/2007 | Rajan |
| 2007/0098020 A1 | 5/2007 | Ja et al. |
| 2007/0106860 A1 | 5/2007 | Foster et al. |
| 2007/0111606 A1 | 5/2007 | Goodwin |
| 2007/0150672 A1 | 6/2007 | Alexander et al. |
| 2007/0162648 A1 | 7/2007 | Tousek |
| 2007/0162654 A1 | 7/2007 | Miwa |
| 2007/0230230 A1 | 10/2007 | Hofstra |
| 2007/0260841 A1 | 11/2007 | Hampel et al. |
| 2008/0031030 A1 | 2/2008 | Rajan et al. |
| 2008/0046666 A1 | 2/2008 | Termaine |
| 2008/0170425 A1 | 7/2008 | Rajan |
| 2008/0215792 A1 | 9/2008 | Jeddeloh |
| 2008/0270741 A1 | 10/2008 | Tremaine |
| 2009/0019195 A1 | 1/2009 | Djordjevic |
| 2009/0063729 A1 | 3/2009 | Gower et al. |
| 2009/0063730 A1 | 3/2009 | Gower et al. |
| 2009/0063731 A1 | 3/2009 | Gower et al. |
| 2009/0063761 A1 | 3/2009 | Gower et al. |
| 2009/0063784 A1 | 3/2009 | Gower et al. |
| 2009/0063785 A1 | 3/2009 | Gower et al. |
| 2009/0063787 A1 | 3/2009 | Gower et al. |
| 2009/0063922 A1 | 3/2009 | Gower et al. |
| 2009/0063923 A1 | 3/2009 | Gower et al. |
| 2009/0125788 A1 | 5/2009 | Wheeler et al. |
| 2009/0190427 A1 | 7/2009 | Brittain et al. |
| 2009/0193200 A1 | 7/2009 | Brittain et al. |
| 2009/0193201 A1 | 7/2009 | Brittain et al. |
| 2009/0193203 A1 | 7/2009 | Brittain et al. |
| 2009/0193290 A1 | 7/2009 | Arimilli et al. |
| 2009/0193315 A1 | 7/2009 | Gower et al. |

OTHER PUBLICATIONS

Nasr, Rami Marwan, "FBSIM and the Fully Buffered DIMM Memory System Architecture", Thesis, 2005, 138 pages.

Lin et al., "DRAM-Level Prefetching for Fully-Buffered DIMM: Design, Performance and Power Saving", ISPASS, 2007, pp. 1-36.

"Quad-Core and Dual-Core Intel Xeon Processor-based Two-Processor Workstations", Intel, see "fully buffered DIMM technology", Oct. 5, 2006, p. 8.

John, Lizy Kurian, "VaWiRAM: A Variable Width Random Access Memory Module", 9th International Conference on VLSI Design, Jan. 1996, pp. 219-224.

Woodacre et al., "The SGI Altix 3000 Global Shared-Memory Architecture", Silicon Graphics, Incorporated, White Paper, 2003.

Haas et al., "Fully-Buffered DIMM Technology Moves Enterprise Platforms to the Next Level", Technology @ Intel Magazine, Mar. 2005, pp. 1-7.

Arimilli et al., "Asynchronous Generation of DRAM Controls from Micro Channel Signals", IBM Technical Disclosure, No. 6, 1992, p. 372.

Howell, J.H., "Dual-Port Control Signal Generator", IBM Technical Disclosure, 1988, pp. 102-104.

Karp et al., "Clock Synchronization Method Speeds Processor Access to Memory", IBM Technical Disclosure, yvol. 38, No. 11, 1995, pp. 7-8.

Alghazo, Jaafar et al., "SF-LRU Cache Replacement Algorithm", Records of the 2004 International Workshop on Memory Technology, Design and Testing (MTDT), Aug. 2004, 6 pages.

Delaluz, V. et al., "Scheduler-Based DRAM Energy Management", Proceedings of the 2002 Design Automation Conference (IEEE Cat. No. 02CH37324), Jun. 2002, pp. 697-702.

Huang, Hai et al., "Improving Energy Efficiency by Making DRAM Less Randomly Accessed", Proceedings of the 2005 International Symposium on Low Power Electronics and Design (IEEE Cat. No. 05th 8842), Aug. 2005, pp. 393-398.

Huang, Hai et al., "Method and System for Decreasing Power Consumption in Memory Array", Jul. 2005, 5 pages.

Park, Jin H. et al., "Coarse Grained Power Management", Proceedings of the International Conference on Embedded Systems and Applications, ESA, 2003, pp. 248-254.

USPTO U.S. Appl. No. 11/848,309, Image File Wrapper printed on Mar. 1, 2010, 1 page.
USPTO U.S. Appl. No. 11/848,312, Image File Wrapper printed on Mar. 1, 2010, 2 pages.
USPTO U.S. Appl. No. 11/848,318, Image File Wrapper printed on Mar. 1, 2010, 2 pages.
USPTO U.S. Appl. No. 11/848,322, Image File Wrapper printed on Mar. 1, 2010, 2 pages.
USPTO U.S. Appl. No. 11/848,335, Image File Wrapper printed on Mar. 1, 2010, 2 pages.
USPTO U.S. Appl. No. 11/848,342, Image File Wrapper printed on Mar. 1, 2010, 2 pages.
USPTO U.S. Appl. No. 11/848,349, Image File Wrapper printed on Mar. 1, 2010, 1 page.
USPTO U.S. Appl. No. 11/848,354, Image File Wrapper printed on Mar. 1, 2010, 1 page.
USPTO U.S. Appl. No. 11/850,190, Image File Wrapper printed on Mar. 1, 2010, 1 page.
USPTO U.S. Appl. No. 11/850,290, Image File Wrapper printed on Mar. 1, 2010, 2 pages.
USPTO U.S. Appl. No. 11/850,353, Image File Wrapper printed on Mar. 1, 2010, 1 page.
USPTO U.S. Appl. No. 12/018,926, Image File Wrapper printed on Mar. 1, 2010, 2 pages.
USPTO U.S. Appl. No. 12/018,972, Image File Wrapper printed on Mar. 1, 2010, 1 page.
USPTO U.S. Appl. No. 12/019,043, Image File Wrapper printed on Mar. 1, 2010, 1 page.
USPTO U.S. Appl. No. 12/019,071, Image File Wrapper printed on Mar. 1, 2010, 2 pages.
USPTO U.S. Appl. No. 12/019,095, Image File Wrapper printed on Mar. 1, 2010, 2 pages.
USPTO U.S. Appl. No. 12/019,141, Image File Wrapper printed on Mar. 1, 2010, 3 pages.
U.S. Appl. No. 11/848,309, filed Aug. 31, 2007, Gower et al.
U.S. Appl. No. 11/850,190, filed Sep. 5, 2007, Gower et al.
U.S. Appl. No. 11/848,312, filed Aug. 31, 2007, Gower et al.
U.S. Appl. No. 11/850,290, filed Sep. 5, 2007, Gower et al.
U.S. Appl. No. 11/848,318, filed Aug. 31, 2007, Gower et al.
U.S. Appl. No. 11/848,322, filed Aug. 31, 2007, Gower et al.
U.S. Appl. No. 11/848,335, filed Aug. 31, 2007, Gower et al.
U.S. Appl. No. 11/848,342, filed Aug. 31, 2007, Gower et al.
U.S. Appl. No. 11/848,349, filed Aug. 31, 2007, Gower et al.
U.S. Appl. No. 11/850,353, filed Sep. 5, 2007, Gower et al.
U.S. Appl. No. 11/848,354, filed Aug. 31, 2007, Gower et al.
U.S. Appl. No. 12/018,926, filed Jan. 24, 2008, Gower et al.
U.S. Appl. No. 12/019,071, filed Jan. 24, 2008, Brittain et al.
U.S. Appl. No. 12/019,043, filed Jan. 24, 2008, Brittain et al.
U.S. Appl. No. 12/019,095, filed Jan. 24, 2008, Brittain et al.
U.S. Appl. No. 12/019,141, filed Jan. 24, 2008, Arimilli et al.
U.S. Appl. No. 12/018,972, filed Jan. 24, 2008, Brittain et al.

Final Office Action mailed Jul. 2, 2010 for U.S. Appl. No. 11/848,335; 17 pages.
Interview Summary mailed Mar. 4, 2010 for U.S. Appl. No. 11/848,322; 3 pages.
Interview Summary mailed Apr. 5, 2010 for U.S. Appl. No. 11/848,318; 3 pages.
Interview Summary mailed Apr. 22, 2010 for U.S. Appl. No. 11/848,335; 3 pages.
Interview Summary mailed Jun. 1, 2010 for U.S. Appl. No. 11/848,309; 3 pages.
Interview Summary mailed Jun. 1, 2010 for U.S. Appl. No. 11/848,312; 3 pages.
Notice of Allowance mailed Mar. 24, 2010 for U.S. Appl. No. 12/019,141; 12 pages.
Notice of Allowance mailed Jun. 10, 2010 for U.S. Appl. No. 11/848,322; 10 pages.
Office Action mailed Mar. 5, 2010 for U.S. Appl. No. 11/848,309, 27 pages.
Response to Office Action filed Apr. 21, 2010 for U.S. Appl. No. 11/848,335; 29 pages.
Response to Office Action filed May 25, 2010 for U.S. Appl. No. 11/848,312; 12 pages.
Response to Office Action filed Jun. 3, 2010 for U.S. Appl. No. 11/848,309; 19 pages.
Response to Office Action filed Mar. 5, 2010 for U.S. Appl. No. 11/848,322, 14 pages.
Notice of Allowance mailed Jul. 15, 2010 for U.S. Appl. No. 11/848,318; 9 pages.
Notice of Allowance mailed Aug. 6, 2010 for U.S. Appl. No. 11/848,335; 5 pages.
Notice of Allowance mailed Aug. 16, 2010 for U.S. Appl. No. 11/848,312; 8 pages.
Notice of Allowance mailed Aug. 19, 2010 for U.S. Appl. No. 11/848,309; 15 pages.
Office Action mailed Aug. 31, 2010 for U.S. Appl. No. 12/019,071; 22 pages.
Office Action mailed Aug. 31, 2010 for U.S. Appl. No. 12/019,095; 21 pages.
Office Action mailed Sep. 1, 2010 for U.S. Appl. No. 12/019,043; 21 pages.
Office Action mailed Sep. 29, 2010 for U.S. Appl. No. 12/018,972; 27 pages.
Notice of Allowance mailed Dec. 3, 2010 for U.S. Appl. No. 12/018,972; 5 pages.
Notice of Allowance mailed Dec. 3, 2010 for U.S. Appl. No. 12/019,071; 5 pages.
Notice of Allowance mailed Dec. 6, 2010 for U.S. Appl. No. 12/019,043; 5 pages.
Notice of Allowance mailed Dec. 9, 2010 for U.S. Appl. No. 12/019,095; 5 pages.
Office Action dated Dec. 23, 2010 for U.S. Appl. No. 11/850,190; 44 pages.
Response to Office Action filed with the USPTO on Oct. 28, 2010 for U.S. Appl. No. 12/018,972; 9 pages.
Response to Office Action filed with the USPTO on Oct. 28, 2010 for U.S. Appl. No. 12/019,043; 8 pages.
Response to Office Action filed with the USPTO on Oct. 28, 2010 for U.S. Appl. No. 12/019,071; 8 pages.
Response to Office Action filed with the USPTO on Oct. 28, 2010 for U.S. Appl. No. 12/019,095; 8 pages.

* cited by examiner

SYSTEM TO PROVIDE MEMORY SYSTEM POWER REDUCTION WITHOUT REDUCING OVERALL MEMORY SYSTEM PERFORMANCE

GOVERNMENT RIGHTS

This invention was made with United States Government support under Agreement No. HR0011-07-9-0002 awarded by DARPA. THE GOVERNMENT HAS CERTAIN RIGHTS IN THE INVENTION.

BACKGROUND

1. Technical Field

The present application relates generally to an improved data processing system and method. More specifically, the present application is directed to providing memory system power reduction without reducing overall memory system performance.

2. Description of Related Art

Contemporary high performance computing main memory systems are generally composed of one or more dynamic random access memory (DRAM) devices, which are connected to one or more processors via one or more memory control elements. Overall computer system performance is affected by each of the key elements of the computer structure, including the performance/structure of the processor(s), any memory cache(s), the input/output (I/O) subsystem(s), the efficiency of the memory control function(s), the main memory device(s), and the type and structure of the memory interconnect interface(s).

Extensive research and development efforts are invested by the industry, on an ongoing basis, to create improved and/or innovative solutions to maximizing overall system performance and density by improving the memory system/subsystem design and/or structure. High-availability systems, i.e. systems that must be available to users without failure for large periods of time, present further challenges related to overall system reliability due to customer expectations that new computer systems will markedly surpass existing systems with regard to mean-time-before-failure (MTBF), in addition to offering additional functions, increased performance, increased storage, lower operating costs, etc. Other frequent customer requirements further exacerbate the memory system design challenges, and include such items as ease of upgrade and reduced system environmental impact, such as space, power, and cooling.

Furthermore, with the movement to multi-core and multi-threaded processor designs, new requirements are being made for the memory subsystem to supply very large data bandwidths and memory capacity into a single processor memory module socket. At a system level, the bandwidth available from the memory subsystem is directly proportional to the number of memory channels that can be supported by the processor pin counts. Further, the capacity of the memory subsystem is limited by the number of memory devices that can be attached to a memory channel and still run within the power constraints of the memory subsystem. Thus, the goal at a system level is to balance the capacity, bandwidth, and power of the memory subsystem to achieve the best memory subsystem performance.

In known memory subsystem designs, the operating frequency of the memory channel frequency is linked to some multiple of the maximum supported operating frequency of the memory devices in the memory subsystem. For example, in a double-data (DDR) random access memory (RAM) design, the maximum operating frequency of the memory devices may be 800 MBits per second and the operating frequency of the memory channel may be 4 times that or 3.2 MBits per second. In another example, for the industry standard fully buffered dual in-line memory module (FB-DIMM) the channel frequency is 6 times the DRAM data rate. The link between the operating frequency of the memory channel and the operating frequency of the memory devices makes it difficult to optimize the capacity, bandwidth, and power for the memory subsystem. For example, as DRAM devices are added to a DIMM to increase the capacity of the DIMM, the additional electrical loading that results from the addition of the DRAM chips will result in a lower frequency of operation of the DRAM interface.

This reduction in frequency on the DIMM will result in a lower frequency on the memory channel as they are linked together by a fixed clock ratio. As in the example above, if the operating frequency of the DDR memory device is lowered to 400 MBits per second, the link between the memory device and the memory channel forces the memory channel data rate to drop to 1.6 Mbits per second or half the bandwidth of the previous example. This fixed ratio effectively results in a reduction of memory bandwidth as the memory capacity is increased. Additionally, a memory subsystem may want to choose to lower DRAM frequency for other reasons such as reducing the power consumption in the memory subsystem, lowering the cost of the memory devices, or the like. With the fixed ratio between the DRAM clock rate and the memory channel rate, this reduction in DRAM frequency results in a direct loss of bandwidth and system performance. Thus, the memory channel frequency link to the frequency of the memory devices presents a limiting factor for optimizing the capacity, bandwidth, and power for the memory subsystem.

SUMMARY

In order to increase the available bandwidth of a memory channel, the illustrative embodiments break the link between the operating frequency of the memory channel and the operating frequency of the memory devices. Typically, the operating frequency of the memory channel is directly linked to some multiple of the operating frequency of the memory devices. At a system level the maximum bandwidth and lowest latency will be when the memory devices are running at the maximum frequency of the memory controller. While the memory channel is capable of operating at other frequencies, any frequency that is lower then the maximum design point of the memory controller will result in lower bandwidth, higher latency and therefore lower performance. In a general computer system, there may be a number of design tradeoffs that will result in a lower operating frequency in the memory subsystem. These design tradeoffs include, but are not limited to, electrical loading due to memory capacity on the memory channels, power reduction in the memory devices that may result in operating the memory devices at a operating frequency lower then the maximum design point, and cost tradeoff's that result in a lower frequency at the memory device interface. By lowering the operating frequency of the memory devices, the operating frequency of the memory channel may also be reduced and, thus, the bandwidth of the memory channel decreases and the latency to access data from memory devices increases.

The illustrative embodiments provide mechanisms for providing a fully asynchronous interface within a memory hub device that breaks the link between the operating frequency of the memory channel and the operating frequency of the memory devices. By breaking the link between operating frequency of the memory channel and the operating frequency of the memory devices, power is saved without impacting overall computer subsystem performance.

The illustrative embodiments provide a memory hub device integrated in a memory module. The illustrative embodiments provide a set of memory devices coupled to the memory hub device. In the illustrative embodiments, the memory hub device comprises a command queue that receives a memory access command from an external memory controller via a memory channel at a first operating frequency. The illustrative embodiments provide a memory hub controller integrated in the memory hub device. In the illustrative embodiments, the memory hub controller reads the memory access command from the command queue at a second operating frequency. By receiving the memory access command at the first operating frequency and reading the memory access command at the second operating frequency, the illustrative embodiments implement an asynchronous boundary within the memory hub device of the memory module. Using the asynchronous boundary, the memory channel operates at a maximum designed operating bandwidth at the first operating frequency while the second operating frequency is independently decreased in order to reduce power being consumed by the set of memory devices.

In the illustrative embodiments, the first operating frequency may be independent of the second operating frequency and the first operating frequency may be a frequency other than a multiple of the second operating frequency. In the illustrative embodiments, the memory hub device may further comprise a write data queue that receives memory write data from the external memory controller via the memory channel at the first operating frequency. In the illustrative embodiments, the memory hub controller may read the memory write data from the write data queue at the second operating frequency. In the illustrative embodiments, receiving the write data at the first operating frequency and reading the write data at the second operating frequency may implement the asynchronous boundary within the memory hub device of the memory module.

In the illustrative embodiments, the memory hub device may further comprise a read data queue that transmits memory read data from the external memory controller via the memory channel at the first operating frequency. In the illustrative embodiments, the memory hub controller may write the read data to the read data queue at the second operating frequency. In the illustrative embodiments, transmitting the read data at the first operating frequency and writing the read data at the second operating frequency may implement the asynchronous boundary within the memory hub device of the memory module.

In the illustrative embodiments, the memory hub device may further comprise a memory device data interface, coupled to a read data queue, a write data queue, and the set of memory devices, that provides a communication path between the set of memory devices and the read data queue or the write data queue. In the illustrative embodiments, the memory hub controller may control the transfer of data between the write data queue and the set of memory devices and the transfer of data between the set of memory devices and the read data queue.

In the illustrative embodiments, the memory hub device may further comprise a link interface, coupled to a memory device data interface, that provides a communication path between the memory module and the external memory controller. In the illustrative embodiments, the memory hub controller may control the transfer of data between the memory device data interface and the link interface. In the illustrative embodiments, the memory hub controller may control the transfer of the memory access command from the link interface to the set of memory devices. In the illustrative embodiments, the memory hub controller may further comprise a memory device sequencer that determines a proper clock cycle to issue the memory access command to the set of memory devices. In the illustrative embodiments, the proper clock cycle may be determined based on at least one of the specification of the set of memory devices or previous memory access commands sent to the set of memory devices.

In the illustrative embodiments, the memory module may be one of a dual in-line memory module (DIMM) or a single in-line memory module (SIMM). In the illustrative embodiments, the memory module may be part of a data processing device.

These and other features and advantages of the present invention will be described in, or will become apparent to those of ordinary skill in the art in view of, the following detailed description of the exemplary embodiments of the present invention.

BRIEF DESCRIPTION OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION OF THE ILLUSTRATIVE EMBODIMENTS

Figure 1:
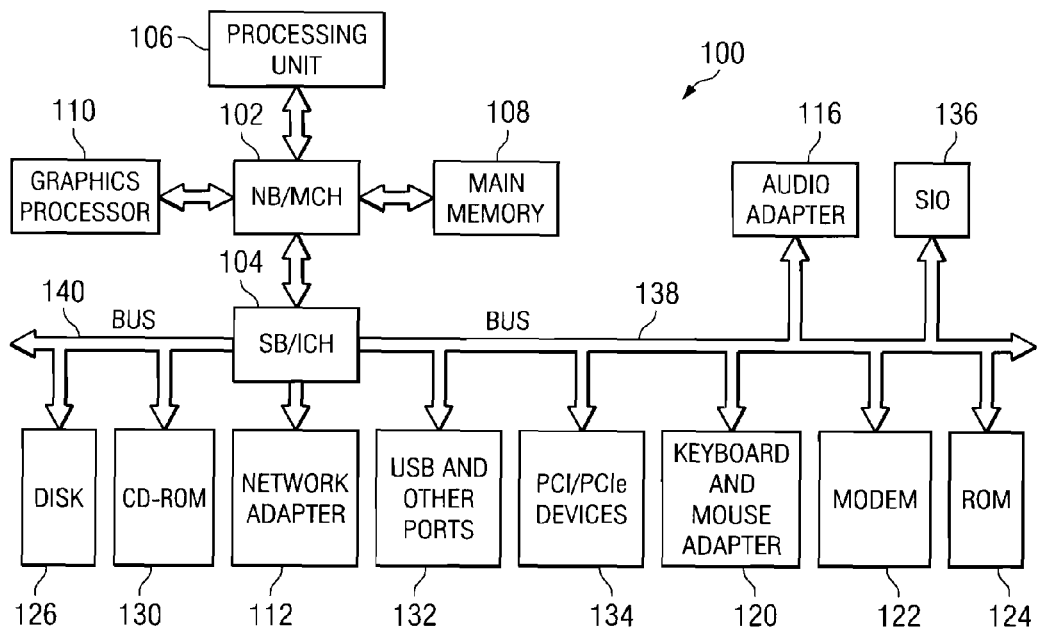
FIG. 1 is a block diagram of an exemplary data processing system in which aspects of the illustrative embodiments may be implemented.

The illustrative embodiments provide mechanisms for a fully asynchronous interface within a memory hub device that breaks the link between the operating frequency of the memory channel and the operating frequency of the memory devices. As such, the mechanisms of the illustrative embodiments may be used with any of a number of different types of data processing devices and environments. For example, the memory subsystem of the illustrative embodiments may be utilized with data processing devices such as servers, client data processing systems, stand-alone data processing systems, or any other type of data processing device. Moreover, the memory subsystems of the illustrative embodiments may be used in other electronic devices in which memories are utilized including printers, facsimile machines, storage devices, flash drives, or any other electronic device in which a memory is utilized. In order to provide a context for the description of the mechanisms of the illustrative embodiments, and one example of a device in which the illustrative embodiments may be implemented, FIG. 1 is provided hereafter as an exemplary diagram of data processing environment in which embodiments of the present invention may be implemented. It should be appreciated that FIG. 1 is only exemplary and is not intended to assert or imply any limitation with regard to the environments in which aspects or embodiments of the present invention may be implemented. Many modifications to the depicted environments may be made without departing from the spirit and scope of the present invention.

With reference now to FIG. 1, a block diagram of an exemplary data processing system is shown in which aspects of the illustrative embodiments may be implemented. Data processing system 100 is an example of a computer in which computer usable code or instructions implementing the processes for illustrative embodiments of the present invention may be located.

In the depicted example, data processing system 100 employs a hub architecture including north bridge and memory controller hub (NB/MCH) 102 and south bridge and input/output (I/O) controller hub (SB/ICH) 104. Processing unit 106, main memory 108, and graphics processor 110 are connected to NB/MCH 102. Graphics processor 110 may be connected to NB/MCH 102 through an accelerated graphics port (AGP).

In the depicted example, local area network (LAN) adapter 112 connects to SB/ICH 104. Audio adapter 116, keyboard and mouse adapter 120, modem 122, read only memory (ROM) 124, hard disk drive (HDD) 126, CD-ROM drive 130, universal serial bus (USB) ports and other communication ports 132, and PCI/PCIe devices 134 connect to SB/ICH 104 through bus 138 and bus 140. PCI/PCIe devices may include, for example, Ethernet adapters, add-in cards, and PC cards for notebook computers. PCI uses a card bus controller, while PCIe does not. ROM 124 may be, for example, a flash binary input/output system (BIOS).

HDD 126 and CD-ROM drive 130 connect to SB/ICH 104 through bus 140. HDD 126 and CD-ROM drive 130 may use, for example, an integrated drive electronics (IDE) or serial advanced technology attachment (SATA) interface. Super I/O (SIO) device 136 may be connected to SB/ICH 104.

An operating system runs on processing unit 106. The operating system coordinates and provides control of various components within the data processing system 100 in FIG. 1. As a client, the operating system may be a commercially available operating system such as Microsoft® Windows® XP (Microsoft and Windows are trademarks of Microsoft Corporation in the United States, other countries, or both). An object-oriented programming system, such as the Java™ programming system, may run in conjunction with the operating system and provides calls to the operating system from Java™ programs or applications executing on data processing system 100 (Java is a trademark of Sun Microsystems, Inc. in the United States, other countries, or both).

As a server, data processing system 100 may be, for example, an IBM® eServer™ System p™ computer system, running the Advanced Interactive Executive (AIX™) operating system or the LINUX® operating system (eServer, System p, and AIX are trademarks of International Business Machines Corporation in the United States, other countries, or both while LINUX is a trademark of Linus Torvalds in the United States, other countries, or both). Data processing system 100 may be a symmetric multiprocessor (SMP) system including a plurality of processors in processing unit 106. Alternatively, a single processor system may be employed.

Instructions for the operating system, the object-oriented programming system, and applications or programs are located on storage devices, such as HDD 126, and may be loaded into main memory 108 for execution by processing unit 106. The processes for illustrative embodiments of the present invention may be performed by processing unit 106 using computer usable program code, which may be located in a memory such as, for example, main memory 108, ROM 124, or in one or more peripheral devices 126 and 130, for example.

A bus system, such as bus 138 or bus 140 as shown in FIG. 1, may be comprised of one or more buses. Of course, the bus system may be implemented using any type of communication fabric or architecture that provides for a transfer of data between different components or devices attached to the fabric or architecture. A communication unit, such as modem 122 or network adapter 112 of FIG. 1, may include one or more devices used to transmit and receive data. A memory may be, for example, main memory 108, ROM 124, or a cache such as found in NB/MCH 102 in FIG. 1.

Those of ordinary skill in the art will appreciate that the hardware in FIG. 1 may vary depending on the implementation. Other internal hardware or peripheral devices, such as flash memory, equivalent non-volatile memory, or optical disk drives and the like, may be used in addition to or in place of the hardware depicted in FIG. 1. Also, the processes of the illustrative embodiments may be applied to a multiprocessor data processing system, other than the SMP system mentioned previously, without departing from the spirit and scope of the present invention.

Moreover, the data processing system 100 may take the form of any of a number of different data processing systems including client computing devices, server computing devices, a tablet computer, laptop computer, telephone or other communication device, a personal digital assistant (PDA), or the like. In some illustrative examples, data processing system 100 may be a portable computing device which is configured with flash memory to provide non-volatile memory for storing operating system files and/or user-generated data, for example. In other illustrative embodiments, data processing device 100 may be any type of digital commercial product that utilizes a memory subsystem in accordance with the illustrative embodiments, as discussed hereafter. For example, data processing device 100 may be a printer, facsimile machine, flash memory device, wireless communication device, game system, portable video/music player, or any other type of consumer electronic device. Essentially, data processing system 100 may be any known or later developed data processing system without architectural limitation.

Furthermore, data processing device 100 may employ many different types of memory for main memory 108. In some illustrative embodiments, main memory 108 may be a memory module, such as a dual in-line memory module (DIMM), single in-line memory module (SIMM), or other memory module or card structure. In general, a DIMM refers to a small circuit board or substrate that is comprised primarily of random access memory (RAM) integrated circuits, or dies, on one or both sides, i.e. planar surfaces, of the circuit board/substrate with signal and/or power pins along both sides of a common edge of the circuit board/substrate. A SIMM refers to a small circuit board or substrate composed primarily of RAM integrated circuits, or dies, on one or both sides, i.e. planar surfaces, of the circuit board/substrate and pins generally along both long edges, with each pin connected to the pin directly (or slightly offset from the pin) on the adjacent side.

As mentioned above, main memory 108 may be accessed by NB/MCH 102 using a high-frequency, high-bandwidth point-to-point interface or other known interfaces such as multi-drop. The interface on the memory module however is limited to the lower-frequency, lower-bandwidth multi-drop eight-byte interface to the memory devices of the contemporary memory module. Typically, the operating frequency of the memory channel is directly linked to some multiple of the maximum supported operating frequency of the memory devices. The illustrative embodiments provide mechanisms for implementing a fully asynchronous interface within a memory hub device that breaks the link between the operating frequency of the memory channel and the operating frequency of the memory devices. While the preferred embodiment is directed to a DIMM, the mechanisms described in the illustrative embodiment may be used with other memories, such as a SIMM, a memory card, a QUIMM (Quad in-line memory module), or other carrier or assembly having electrical and dimensional attributes optimally suited for a given system environment.

In order to increase the memory bandwidth of the memory subsystem, the illustrative embodiments implement a fully asynchronous interface within a memory hub device. Providing a fully asynchronous interface on the memory hub device results in the memory channel being able to operate at a maximum operating frequency independent of the operating frequency of the memory devices. The memory channel operating at a maximum operating frequency allows the maximum bandwidth per pin on the memory channel to the processor thereby improving system performance. Additionally, providing a fully asynchronous interface allows computer system power saving without impacting computer system performance.

Figure 2:
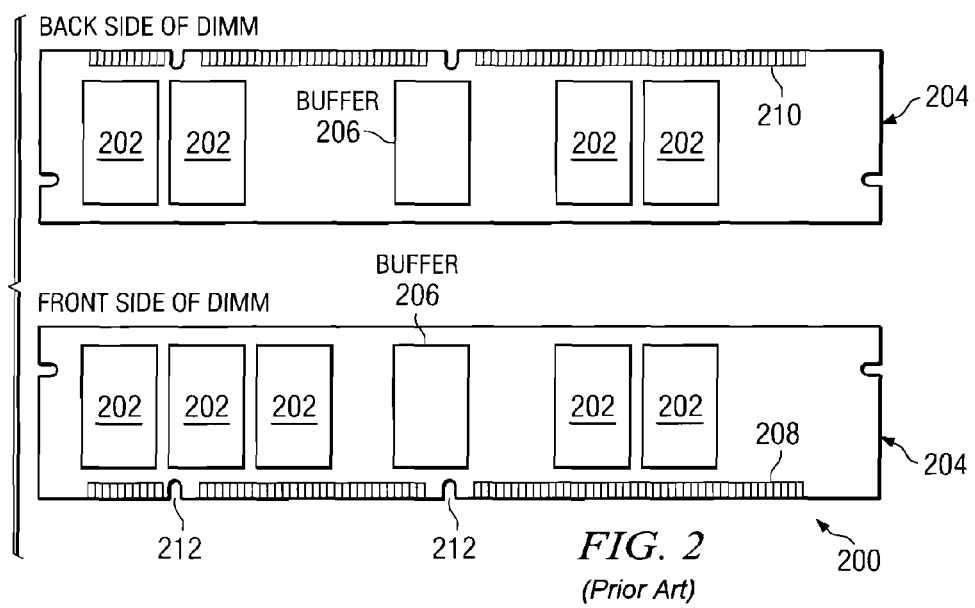
FIG. 2 depicts an exemplary synchronous memory module, such as a dual in-line memory module (DIMM)

FIG. 2 depicts an exemplary memory module, such as a dual in-line memory module (DIMM). Memory module 200 depicted in FIG. 2 may be part of main memory in a data processing device or system, such as main memory 108 in data processing system 100 of FIG. 1. Memory module 200 depicts a front planar side and a back planar side of a DIMM design for nine synchronous dynamic random access memory (SDRAM) chips 202, which may also be referred to as memory devices. In the depiction of FIG. 2, the backside view of the DIMM (top of drawing) may be rotated down such that the notches, or keys, on the edges are aligned with the notches, or keys, on the edges of the front side view of the DIMM (bottom of drawing).

In the depicted example, SDRAM chips 202 are arranged on the front and back sides of printed circuit board 204 with corresponding buffer 206 centrally disposed on each side. Thus, SDRAM chips 202 may be referred to as being disposed on a right side and a left side, relative to buffer 206, of the front side and on a right side and a left side, relative to buffer 206, of the back side. When viewed as an assembled memory module, connector pins 208 on the front side of printed circuit board 204 are disposed along a common edge with connector pins 210 on the back side of printed circuit board 204.

Keys 212 provide a positive mechanical interlock for systems solely supporting DRAM or SDRAM. In the exemplary embodiment, systems supporting both DRAM and SDRAM would have no connector key in this position. A side edge key may be used to inform the controller of the type of memory technology employed, e.g., flash write, EPROM, etc. or in other embodiments, may be used to identify operating voltage or other operational features for which a mechanical means is optimal to prevent system or module damage. Memory module 200 may be coupled to a memory controller of a data processing system, which controls the reading and writing of data from and to memory module 200. The DIMM depicted in FIG. 2 includes 168 pins in the exemplary illustration, whereas subsequent DIMMs may be constructed with pin-counts ranging from 100 pins to over 300 pins, and in alternate exemplary embodiments, pins may be placed on more than one edge to permit interconnection to alternate interfaces (e.g. test, diagnostic, characterization, add-on memory/extended memory, etc).

Figure 3:
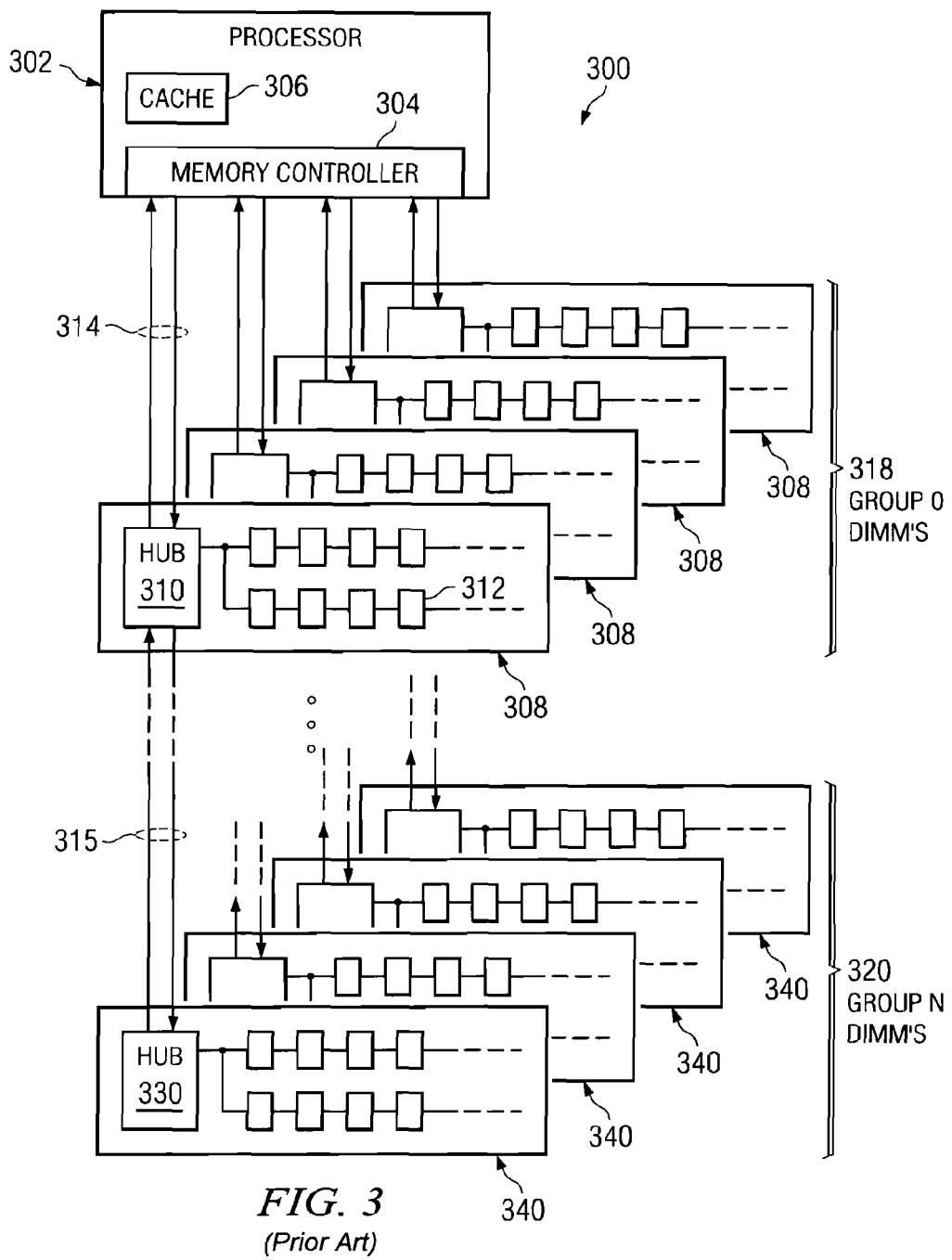
FIG. 3 illustrates an exemplary data processing system coupled to a subsystem of memory modules.

FIG. 3 illustrates an exemplary data processing system coupled to a subsystem of memory modules. Data processing system 300 includes processor 302, with memory controller 304 and cache 306 integrated thereon, and one or more memory modules 308, such as memory module 200 of FIG. 2. Each of the memory modules 308 may include a memory hub device 310 connected to one or more memory devices 312. Each of memory modules 308 connects via bus structures 314 or memory channels that are connected to processor 302 through a cascade interconnect bus structure, which may also be referred to as a hub-and-spoke topology. Memory controller 304 is interconnected to memory hub devices 310 of the memory modules 308 via one or more memory channels 314. Memory hub devices 310 may also be interconnected to other memory hub devices 330 of other memory modules 340 in an nth group of memory modules, such as module groups 318 or 320, or to a standalone repeater hub device using memory channel 315.

Each memory hub device 310 and 330 provides one or more low speed connection(s) to groups of memory devices 312 following, for example, the fully buffered DIMM standard. The connections to the memory devices may include both common and independent signals to the one or more memory devices, with the signals comprising one or more of data, address, command, control, status, reset, and other signals present in contemporary or future memory devices. Multiple identically configured memory modules 308 are logically grouped together into module groups 318 and 320, and may be operated on in unison or with a subset of the modules selected based on the commands issued by memory controller 304 to provide for optimal latency, bandwidth, and error correction effectiveness for system memory cache line transfer, diagnostics, and other communication modes to the memory storage.

In the exemplary embodiment, memory controller 304 translates system requests for memory access into packets according to a memory hub device communication protocol. Typically, memory write packets contain at least a command, address, and associated data. Memory read packets typically contain at least a command and address, and imply that an expected packet will be returned which contains the requested data and/or information related to the read request. Memory controller 304 sends the memory write packets and memory read packets to memory hub device 310 of a memory module 308. Memory hub device 310 routes the packets to a corresponding memory device 312 associated with memory hub device 310 or another memory hub device 330 of another memory module 340, or a standalone repeater hub device. The details of how memory hub device 310 may route the packets in this manner will be provided with reference to FIG. 4 hereafter.

Figure 4:
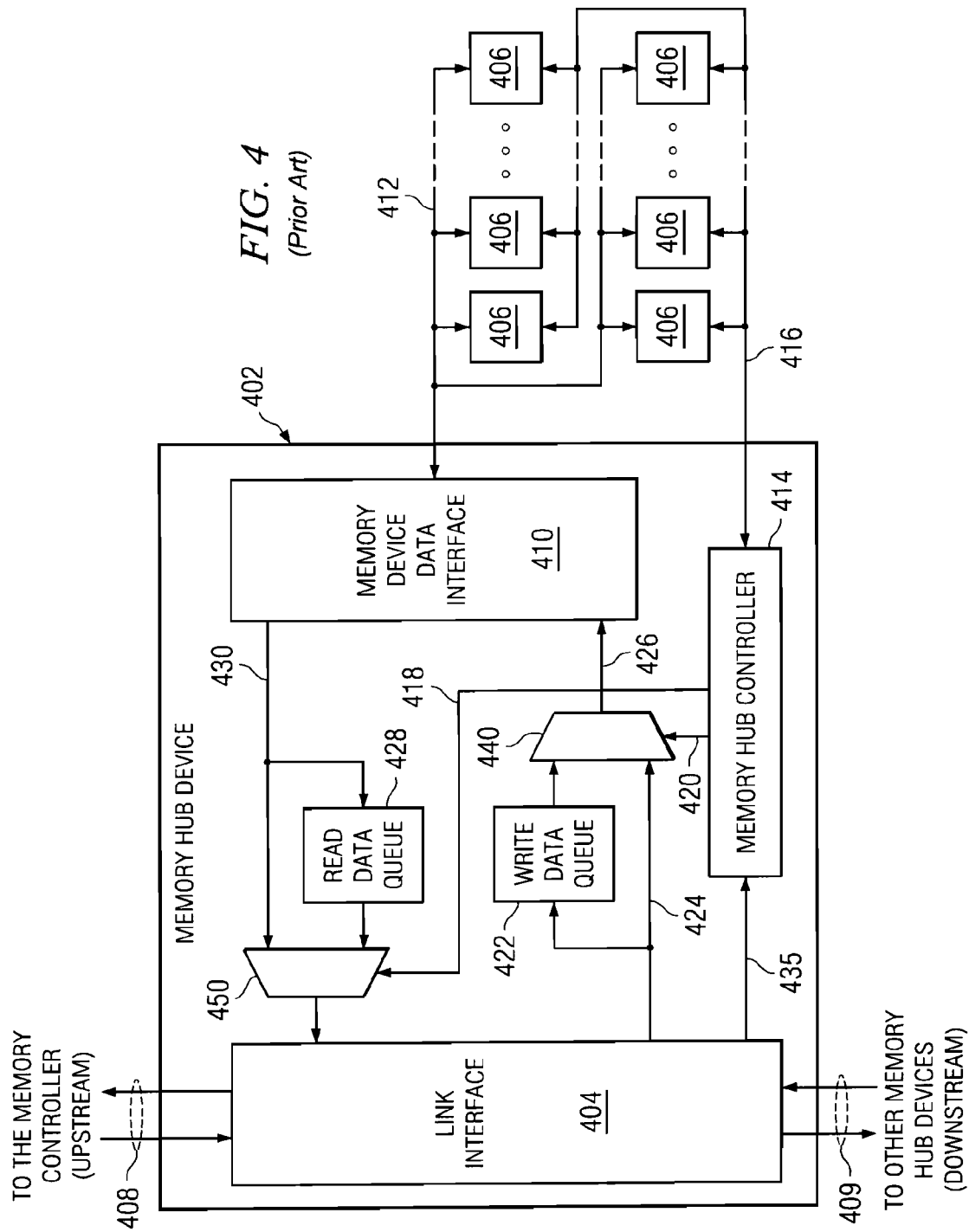
FIG. 4 depicts an exemplary block diagram of a memory hub device of a memory module.

FIG. 4 depicts an exemplary block diagram of a memory hub device of a memory module. Memory hub device 402, such as memory hub device 310 of FIG. 3, may be connected to a memory controller (not shown), such as memory controller 304 of FIG. 3, through memory channel 408, which may be a multi-drop bus structure, point-to-point bus structure, or the like, that may further include a cascade connection to one or more additional memory hub devices or standalone repeater hub devices. In the exemplary embodiment, memory channel 408 is a high bandwidth bus structure on which memory access requests are transmitted and received by the memory controller through the memory channel to and from memory hub device 402.

Exemplary memory hub device 402 comprises link interface 404 that receives high-speed memory access requests from an upstream or downstream memory hub device (not shown) or from a memory controller (not shown) via memory channel 408 or 409. Link interface 404 also provides the means to re-synchronize, translate, and re-drive high-speed memory access requests to memory devices 406 and/or to re-drive the high-speed memory access requests downstream or upstream on memory channel 409 as applicable using known memory system communication protocols. Link interface 404 may also receive read data packets from a downstream or upstream memory hub device (not shown) on memory channel 409. Link interface 404 may select between the read data packets from the downstream or upstream memory hub device and the data from memory devices 406 internal to memory hub device 402 using known memory system communication protocols, and then send the data upstream or downstream on memory channel 408.

Memory hub controller 414 responds to access request packets, i.e. write packets and read packets, by responsively driving memory devices 406 using memory device address and control bus 416. Memory hub controller 414 also controls data flow by directing read data flow selector 418 and write data flow selector 420. Link interface 404 decodes the data packets received from the memory controller and directs the address and command information to memory hub controller 414. Memory write data from link interface 404 may be temporarily stored in write data queue 422 before being provided to multiplexer 440. Alternatively, the memory write data may be directly driven to multiplexer 440 via internal bus 424. Memory hub controller 414 uses the address of the write data and control information from the write packet to control write data flow selector 420 and, thus, multiplexer 440 such that multiplexer 440 sends the memory write data from write data queue 422, where the address specific write data may be stored, or internal bus 424 if the address specific write data is sent directly from link interface 404. The memory write data may then be sent via internal bus 426 to memory device data interface 410. Memory device data interface 410 then sends the memory write data to memory devices 406 via memory device data bus 412. While all of memory devices 406 receive the write data, only the memory device having the address of the write data actually stores the write data.

Read data may also be provided from memory devices 406 to memory device data interface 410 via memory device data bus 412. Memory device data interface 410 may provide the read data to multiplexer 450 directly via internal bus 430 or indirectly via read data queue 428 and internal bus 430. Multiplexer 450 outputs data to link interface 404 using read data flow selector 418 under control of memory hub controller 414. Memory hub controller 414 uses the address of the read data to control read data flow selector 418 and, thus, multiplexer 450 so that multiplexer 450 sends read data from read data queue 428, where the address specific read data may be stored, or internal bus 430 if the address specific read data is to be sent directly to link interface 404. Link interface 404 may then transmit the read data upstream on memory channel 408 to a memory controller in a processor as one or more read reply packet(s).

In the exemplary embodiments, memory device data interface 410 is an eight-byte data interface that manages the technology-specific data interface with memory devices 406, and further controls the bi-directional memory device data bus 412. However, memory device data interface 410 may be comprised of more or less bytes based on the application requirements, alternate reliability structures (requiring more or less data bits), mechanical (and other) limitations or the like.

As an example of the command flow for a write command, when the memory controller, such as memory controller 304 of FIG. 3, issues a write command to memory devices 406 on memory hub device 402, the memory controller will transmit both a write command and write data to memory hub device 402 via memory channel 408. Link interface 404 decodes the address information associated with the write data and, if the write data is targeted to memory devices 406, link interface 404 moves the write data to a buffer in write data queue 422. The selection of a buffer may be determined in many ways, such as a first in first out queuing method, a buffer implicitly defined in the write command, or other buffer management implementation. Memory hub device 402 generally stores the write data in write data queue 422 prior to the write command being issued, but, depending on the protocol of memory devices 406 and memory channel 408, some or all of the write data may be transferred directly from link interface 404 to memory device data interface 410 via multiplexer 440 under control of memory hub controller 414 and write data flow selector 420. Memory hub controller 414 uses the address of the write data and write command to control write data flow selector 420 and, thus, multiplexer 440 so that multiplexer 440 sends the memory write data from write data queue 422, where the address specific write data may be stored, or internal bus 424 if the address specific write data is sent directly from link interface 404.

After the write data has been transferred, the memory controller will issue a write command to link interface 404 on memory channel 408. Control logic in link interface 404 will, in parallel, forward the write command to downstream memory hub devices on memory channel 409 and further decode the write command to determine if the write command is targeted at memory devices 406 attached to memory hub device 402. If the write command is targeted for memory devices 406, link interface 404 forwards the write command to memory hub controller 414 to be executed via internal bus 435. Memory hub controller 414 converts the write command into the correct protocols for memory devices 406 installed on memory module. Memory hub controller 414 sends the write command to memory devices 406 over memory device address and control bus 416. While all of memory devices 406 receive the write command, only the memory device with the address of the write data actually executes the write command. If the write data is stored in write data queue 422, memory hub controller 414 transfers, at an appropriate time, the write data from write data queue 422 to memory device data interface 410 using write data flow selector 420. Memory device data interface 410 forwards the write data to memory devices 406 on memory device data bus 412.

An example of the command flow for a read command, when memory hub device 402 receives a read command on memory channel 408, control logic in link interface 404 will, in parallel, forward this read command to any downstream memory hub device on memory channel 409, and further decode the read command to determine if the read command is targeted at memory device 406 attached to memory hub device 402. If link interface 404 determines that the read command is targeted for memory hub device 402, link interface 404 forwards the read command using internal bus 435 to memory hub controller 414 to be executed. Memory hub controller 414 converts the read command into the correct protocols for memory devices 406 installed on the memory module. Memory hub controller 414 then sends the read command to memory devices 406 over memory device address and control bus 416. While all of memory devices 406 receive the read command, only the memory device with the address of the read data actually executes the read command and sends the read data to memory device data interface 410. Memory devices 406 execute the read command and transfer a read data packet to memory device data interface 410 over memory device data bus 412.

Under control of memory hub controller 414, memory device data interface 410 transfers the read data packet to either read data queue 428 or directly to link interface 404 to be transferred back to the memory controller using memory channel 408. Memory hub controller 414 uses the address of the read data to control read data flow selector 418 and, thus, multiplexer 450 so that multiplexer 450 sends the memory read data from read data queue 428, where the address specific read data may be stored, or internal bus 430 if the address specific read data is to be sent directly to link interface 404. If the read data is stored in read data queue 428, memory hub controller 414 will decide when to move the stored data to link interface 404 depending on the state of read data queue 428 and the state of link interface 404. If there is already data in read data queue 428 pending transfer to link interface 404, then memory hub controller 414 directs the new read data to read data queue 428. Memory hub controller 414 directs data out of read data queue 428 in a first in, first out manner. Additionally, if link interface 404 is busy moving data from memory channel 409, then memory hub controller 414 delays the transfer of read data until there is an opening on memory channel 408. Any known method may be used to manage read data queue 428.

The illustrative embodiments provide mechanisms for implementing a fully asynchronous interface within a memory hub device. The fully asynchronous interface breaks the link between the operating frequency of the memory channel and the operating frequency of the memory devices. Providing a fully asynchronous interface on the memory hub device results in the memory channel being able to operate at a maximum operating frequency independent of the operating frequency of the memory devices. The memory channel operating at a maximum operating frequency allows the maximum bandwidth per pin on the memory channel to the processor thereby improving system performance. Additionally, providing a fully asynchronous interface allows computer system power saving without impacting computer system performance.

Figure 5:
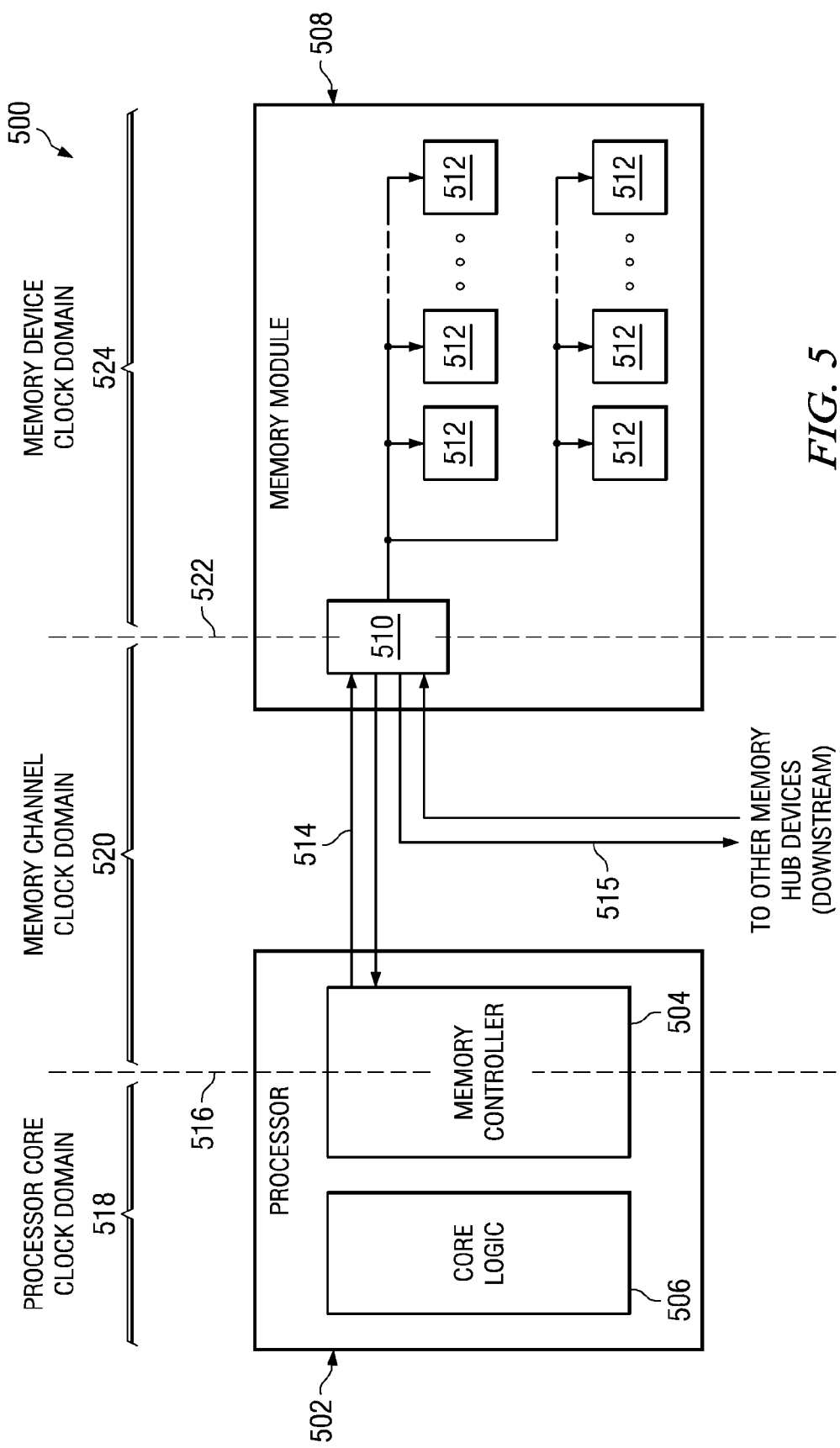
FIG. 5 depicts an exemplary data processing system that implements a fully asynchronous interface in accordance with an illustrative embodiment.

FIG. 5 depicts an exemplary data processing system that implements a fully asynchronous interface in accordance with an illustrative embodiment. Data processing system 500 includes processor 502, with memory controller 504 and core logic 506 integrated thereon, and memory module 508, such as memory module 200 of FIG. 2. Memory module 508 may include memory hub device 510 connected to one or more memory devices 512. Memory module 508 connects via memory channels 514 or bus structures that are connected to processor 502. Memory controller 504 is interconnected to memory hub devices 510 of the memory module 508 via one or more memory channels 514. Memory hub devices 510 may also be interconnected to other memory hub devices of other memory modules, such as a DIMMs or a standalone repeater hub device using memory channels 515.

Memory hub device 510 provides one or more low speed connection(s) to memory devices 512 following, for example, the industry standard Double Date Rate (DDR) DRAM interface specification. In known memory systems, fully asynchronous boundary 516 is implemented within memory controller 504 such that memory controller 504 interfaces with elements within processor 502 using processor core clock domain 518 and memory controller 504 interfaces with memory devices 512 using memory channel clock domain 520, which is some multiple of the maximum supported operating frequency of memory devices 512. This asynchronous boundary allows processor 502 to operate at any frequency without degrading the memory subsystem performance. With this design point, processor 502 may operate at its maximum performance level in processing system 500. However, memory controller 504 is still locked into the operating frequency of memory devices 512 which may result in lost performance in the memory subsystem. In order to break the link between the operating frequency of memory channel clock domain 520 and the operating frequency of memory devices 512, fully asynchronous boundary 522 is implemented within data processing system 500 and more specifically within memory hub device 510.

By implementing fully asynchronous boundary 522, memory controller 504 is able to operate memory channels 514 at an operating frequency that is only limited by the system design point of memory channels 514, processor 502, and memory hub 510, rather than the operating frequency of memory devices 512. This asynchronous boundary in memory hub 510, allows memory channels 514 to run at a frequency that is independent of memory devices 512. This frequency may be higher, lower, or the same as memory devices 512. Since memory controller 504 is no longer in lock step with memory devices 512, memory controller 504 will be capable of sending commands at a rate that is faster than memory devices 512 can accept. To avoid over-running the capability of memory devices 512 attached to single memory hub 510, memory controller 504 will have knowledge of the actual command queue depth in memory hub 510 and will have a mechanism to detect the completion of a command. This mechanism may be any known method of remote queue management known to the industry, for example a credit based scheme, a command execution acknowledgment protocol, or the like. Thus, as additional memory modules 508 are added to data processing system 500, processor 502 loads information regarding the capacity of each memory hub 510 and memory devices 512 into memory controller 504 and memory controller 504 uses this information when sending requests to memory modules 508.

Memory hub device 510 receives the requests from memory controller 504 via memory channels 514 and 515 at the operating frequency associated with memory channel clock domain 520 and routes the requests to a set of addressed memory devices 512 at the maximum supported operating frequency associated with the memory device clock domain 524. Memory controller 504 in processor 502 also generates and maintains the execution order of the requests that are issued across fully asynchronous boundary 522 so that memory hub device 510 does not have to have any native intelligence to decide the most efficient execution order of the requests. Memory hub device 510 may receive the command stream and execute the commands in the order received to maintain the execution order that was issued by memory controller 504. However, since the requests are crossing from memory channel clock domain 520 into memory device clock domain 524, memory hub device 510 is not capable of maintaining the timing sequence for the requests across fully asynchronous boundary 522. These timing sequences are defined by memory devices 512 specification and must be adhered to for proper operation of memory devices 512.

Since the timing sequence of requests is important so as to meet specifications of the memory devices 512, memory hub device 510 shifts the request stream "in time" to avoid violations of memory devices 512 timing parameters. In other words, the memory hub device 510 will insert cycles between commands so that the timing sequence seen by the memory devices 512 will not violate its specification. In order to shift the request stream "in time", memory hub device 510 implements a memory device sequencer so that memory hub device 510 has knowledge of the timing parameters of memory devices 512 but does not have to make any decisions on the correct order of the requests. The details of how memory hub device 510 may implement a memory device sequencer will be provided with reference to FIG. 6 hereafter.

By implementing fully asynchronous boundary 522 within memory hub device 510, data processing system 500 may further realize power saving without impacting system performance. In known memory subsystems, multiple memory devices 512 may be daisy-chained together on a single memory channel 514 by adding additional memory modules 508 attached to downstream memory channel 515. As memory modules 508 are daisy-chained together, the combined bandwidth of memory modules 508 may exceed the bandwidth of memory channels 514 that support the daisy-chained memory modules 508. In large memory subsystems, the total memory power needed to support the various daisy-chained memory modules 508 is a significant cost and design issue. Known systems manage the required power by lowering the operating frequency of memory devices 512, which will in effect lower the power used in the memory subsystem. By lowering the operating frequency of memory devices 512, known systems lower the operating frequency of memory channels 514 and, thus, lower the bandwidth of memory channels 514. By implementing fully asynchronous boundary 522 within memory hub device 510, the operating frequency of memory devices 512 may be lowered without changing the operating frequency of memory channels 514, thereby lowering total power used by memory devices 512 without affecting the system performance.

Figure 6:
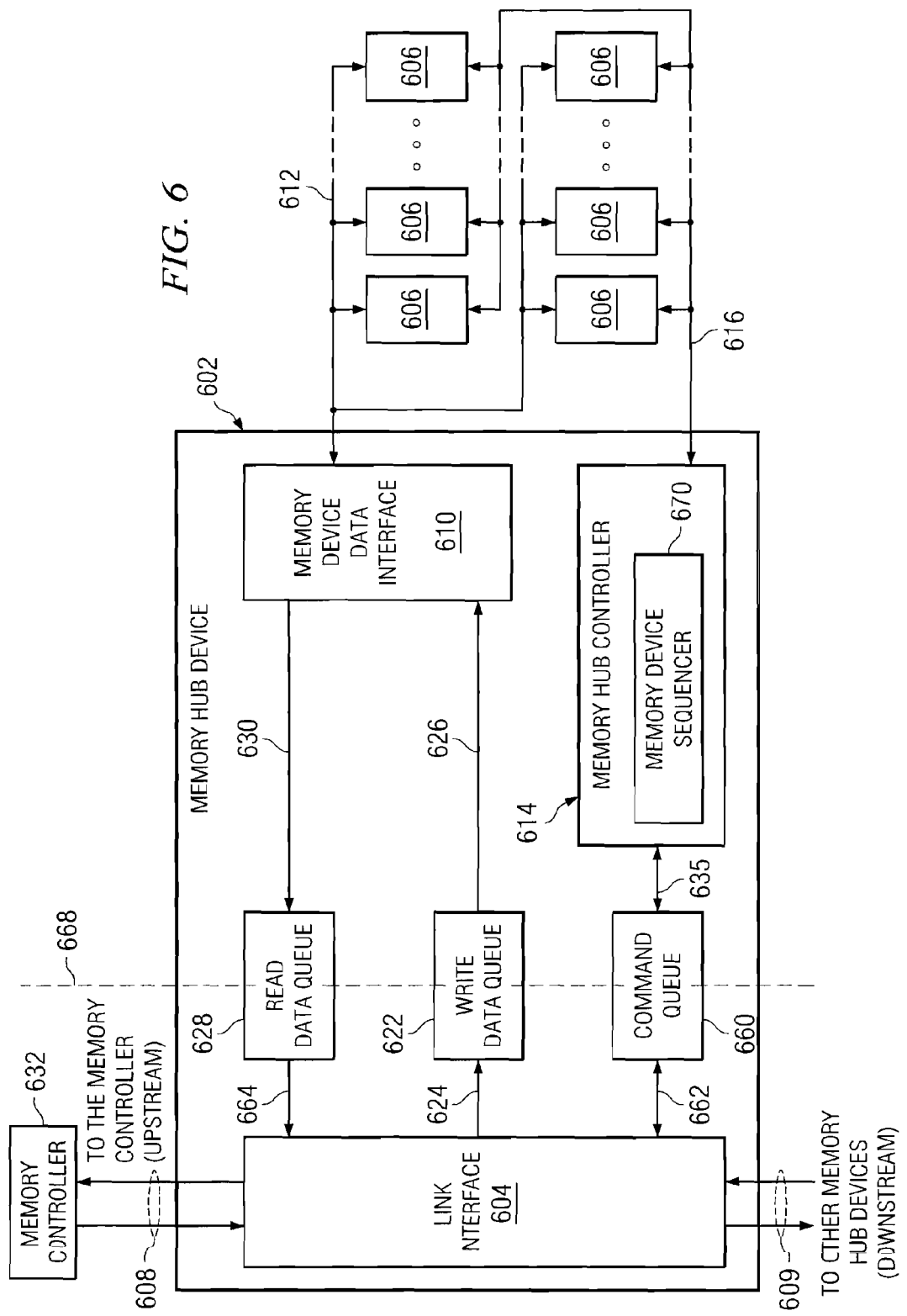
FIG. 6 depicts an exemplary buffered memory module within a memory system that implements a fully asynchronous interface in accordance with one illustrative embodiment.

FIG. 6 depicts an exemplary buffered memory module within a memory system that implements a fully asynchronous interface in accordance with one illustrative embodiment. Exemplary memory hub device 602 includes, in addition to the elements particular to the illustrative embodiments, elements that are similar to elements depicted in memory hub device 402 of FIG. 4. Thus, elements in FIG. 6 that are not specifically described as operating differently from elements in FIG. 4 are intended to operate in a similar manner as their corresponding elements in FIG. 4. For example, memory hub device 602 includes link interface 604, memory devices 606, and memory channels 608 and 609, each of which operate in a similar manner to that described with the corresponding elements in FIG. 4. However, to provide a fully asynchronous interface that breaks the link between the operating frequency of memory devices 606 and the operating frequency of memory controller 632, memory hub device 602 routes data access requests and reply packets through write data queue 622, read data queue 628, and command queue 660. By routing the data access requests through write data queue 622, read data queue 628, and command queue 660, link interface 604 may route data access requests at the operating frequency of memory channel 608, while memory hub controller 614 and memory device data interface 610 may route data access requests at the operating frequency of memory devices 606, thereby creating fully asynchronous boundary 668, such as fully asynchronous boundary 522 of FIG. 5. In the illustrative embodiments, the transfer of data is different for read data transfers and write data transfers, as described hereafter.

When memory controller 632 issues data access requests, link interface 604 decodes the command packets of the data access requests received from memory controller 632 and directs the address and command information at a operating frequency of memory controller 632 to command queue 660 using internal bus 662. Then, memory hub controller 614 reads the received address and command information from command queue 660 via internal bus 635 using the operating frequency of memory devices 606. Memory hub controller 614 responds to access request packets, i.e. write packets and read packets, by responsively driving memory devices 606 using memory device address and control bus 616. Link interface 604 may temporarily store, at the operating frequency of memory controller 632, memory write data in write data queue 622 via internal bus 624 before memory hub controller 614 moves the write data, at the operating frequency of memory devices 606, to memory device data interface 610 via internal bus 626. Memory device data interface 610 then sends the memory write data to memory devices 606 via memory device data bus 612. While all of memory devices 606 receive the write data, only the memory device having the address of the write data actually stores the write data.

As an example of the command flow for a write command, when memory controller 632, such as memory controller 504 of FIG. 5, issues a write command to memory devices 606 coupled to memory hub device 602, memory controller 632 will transmit both a write command and write data to memory hub device 602 via memory channel 608. Link interface 604 will, in parallel, forward the write data to downstream memory hub devices on memory channel 608 and further decode the address information associated with the write data and, if the write data is targeted to memory devices 606, link interface 604 moves the write data to a buffer in write data queue 622, at the operating frequency of memory controller 632. After the write data has been transferred to write data queue 622, memory controller 632 will issue a write command to link interface 604 on memory channel 608. Control logic in link interface 604 will, in parallel, forward the write command to downstream memory hub devices on memory channel 609 and further decode the write command to determine if the write command is targeted at memory devices 606 attached to memory hub device 602.

If the write command is targeted for memory devices 606, link interface 604 forwards the write command to command queue 660 via internal bus 662, at the operating frequency of memory controller 632. Memory hub controller 614 retrieves the write command from command queue 660 using internal bus 635, at the operating frequency of memory devices 606. Memory hub controller 614 converts the write command into the correct protocols for memory devices 606 installed on memory module. Memory hub controller 614 may use memory device sequencer 670 contained within memory hub controller 614 to determine the proper clock cycle to issue the memory write command to memory devices 606. The proper clock cycle may be determined by memory devices 606 specification and the previous commands that have been issued to memory devices 606. Once memory hub controller 614 has determined the correct cycle to issue the command, memory hub controller 614 may delay the memory write command the proper number of cycles to place the memory write command on memory device address and control bus 616 during the first clock cycle that would not be in violation of any of memory devices 606 specifications. Memory hub controller 614 sends the write command to memory devices 606 over memory device address and control bus 616. While all of memory devices 606 receive the write command, only the memory device with the address of the write data actually executes the write command. At an appropriate time, memory hub controller 614 transfers the write data stored in write data queue 622, at the operating frequency of memory devices 606, to memory device data interface 610. Memory device data interface 610 forwards the write data to memory devices 606 on memory device data bus 612.

Read data may also be provided from memory devices 606 to memory device data interface 610 via memory device data bus 612. Memory device data interface 610 may provide, at the operating frequency of memory devices 606, the read data to read data queue 628 via internal bus 630. Memory hub controller 614 uses the address of the read data to send the read data from read data queue 628, at the operating frequency of memory controller 632, to link interface 604 via internal bus 664. Link interface 604 may then transmit the read data upstream on memory channel 608 to memory controller 632 in a processor as one or more read reply packet(s).

An example of the command flow for a read command, when memory hub device 602 receives a read command on memory channel 608, control logic in link interface 604 will, in parallel, forward this read command to any downstream memory hub device on memory channel 609, and further decode the read command to determine if the read command is targeted at memory devices 606 attached to memory hub device 602. If link interface 604 determines that the read command is targeted for memory hub device 602, link interface 604 forwards the read command, at the operating frequency of memory controller 632, to command queue 660 via internal bus 662. Memory hub controller 614 retrieves, at the operating frequency of memory devices 606, the read command from command queue 660 using internal bus 635. Memory hub controller 614 converts the read command into the correct protocols for memory devices 606 installed on the memory module. Memory hub controller 614 may use memory device sequencer 670 contained within memory hub controller 614 to determine the proper clock cycle to issue the memory read command to memory devices 606. The proper clock cycle may be determined by memory devices 606 specification and the previous commands that have been issued to memory devices 606. Once memory hub controller 614 has determined the correct cycle to issue the command, memory hub controller 614 may delay the memory read command the proper number of cycles to place the memory read command on memory device address and control bus 616 during the first clock cycle that would not be in violation of any of memory devices 606 specifications. Memory hub controller 614 then sends the read command to memory devices 606 over memory device address and control bus 616. While all of memory devices 606 receive the read command, only the memory device with the address of the read data actually executes the read command and sends the read data to memory device data interface 610. Memory devices 606 execute the read command and transfer a read data packet to memory device data interface 610 over memory device data bus 612.

Under control of memory hub controller 614, memory device data interface 610 transfers, at the operating frequency of memory devices 606, the read data packet to read data queue 628. Memory hub controller 614 uses the address of the read data to send, at the operating frequency of memory controller 632, the memory read data from read data queue 628 to link interface 604, so that link interface 604 may direct the read data to memory controller 632 via memory channel 608. Memory hub controller 614 directs data out of read data queue 628 in a first in, first out manner. Additionally, if link interface 604 is busy moving data from memory channel 609, then memory hub controller 614 delays the transfer of read data until there is an opening on memory channel 608. Any known method may be used to manage read data queue 628.

Memory controller 632 maintains the execution order of the requests that are issued across fully asynchronous boundary 668 so that memory hub device 602 does not have to have any native intelligence to decide the most efficient execution order of the requests. However, since the requests are crossing from a memory channel clock domain into a memory device cloak domain, memory hub device 602 implements memory device sequencer 670 in order to maintain knowledge of the timing parameters of memory devices 606 without having to decide the correct order of the requests sent by memory controller 632. Memory device sequencer 670 shifts the request stream from memory controller 632 "in time" to avoid violations of memory devices 606 timing parameters. To shift commands into the correct clock cycle, memory hub controller 614 may keep a history of the commands that have been sent to memory devices 606 and using this history memory hub controller 614 may determine the correct clock cycle to issue the next command to memory devices 606. Memory device sequencer 670 uses timing parameters from memory devices 606 specifications to determine when the next command in command queue 660 may be issued to memory devices 606.

For example, for an industry standard Double Data Rate (DDR) DRAM device there are numerous timing parameters that have to be met for the device to operate properly. One example would be the time required between a write command and a read command to memory devices 606. For this example, if memory device sequencer 670 sees the next command in command queue 660 is a read command, memory device sequencer 670 may look back in time (back in clock cycles) to see when the last write command was issued to the addressed memory devices 606. If the amount of time that has passed since the last write command is equal to or greater then the required time based on memory devices 606 specification, then memory device sequencer 670 may issue the command to memory devices 606 over memory device address and control bus 616. If the amount of time that has passed since the last write command is less then the required amount, then memory device sequencer 670 may wait until enough time has passed before issuing the command to memory devices 606 over memory device address and control bus 616. Memory device sequencer 670 may follow this same procedure for all the timing parameters in memory devices 606 specification and will delay the command execution until all timing parameters are satisfied. Note that since memory hub device 602 is required to maintain the order of execution of the commands from memory controller 632, memory hub controller 614 will only execute the commands in the command queue 660 in a FIFO manner.

By implementing fully asynchronous boundary 668 within memory hub device 602, the data processing system in which memory hub controller 632 and memory hub device 602 are implemented may further realize power saving without impacting system performance. In known memory subsystems, multiple memory devices 606 may be daisy-chained together on a single one of memory channels 608 and 609. As memory devices 606 are daisy-chained together, the combined bandwidth of memory devices 606 may exceed the bandwidth of memory channels 608 and 609 that support the daisy-chained memory devices 606. In large memory subsystems, the total memory power needed to support the various daisy-chained memory devices 606 is an issue. Known systems manage the required power by lowering the operating frequency of memory devices 606, which will in effect lower the power used in the memory subsystem. By lowering the operating frequency of memory devices 606, known systems lower the operating frequency of memory channels 608 and 609 and, thus, lower the bandwidth of memory channels 608 and 609. By implementing fully asynchronous boundary 668 within memory hub device 602, the operating frequency of memory devices 606 may be lowered without changing the operating frequency of memory channels 608 and 609, thereby lowering total power used by memory devices 606 without affecting the system performance.

Thus, the illustrative embodiments provide mechanisms for a fully asynchronous interface within a memory hub device. Providing a fully asynchronous interface on the memory hub device results in the memory channel being able to operate at a maximum operating frequency independent of the operating frequency of the memory devices. The memory channel operating at a maximum operating frequency allows the maximum bandwidth per pin on the memory channel to the processor thereby improving system performance. Additionally, providing a fully asynchronous interface allows computer system power saving without impacting computer system performance.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A memory system, comprising:
    a memory hub device integrated in a memory module;
    a set of memory devices coupled to the memory hub device, wherein the memory hub device comprises a command queue that receives a memory access command from an external memory controller via a memory channel at a first operating frequency; and
    a memory hub controller integrated in the memory hub device, wherein the memory hub controller reads the memory access command for the set of memory devices from the command queue at a second operating frequency, wherein receiving the memory access command at the first operating frequency and reading the memory access command at the second operating frequency implements a fully asynchronous boundary within the memory hub device, wherein, using the asynchronous boundary, the memory channel operates at a maximum designed operating bandwidth at the first operating frequency, and wherein the second operating frequency is independently decreased in order to reduce power being consumed by the set of memory devices.

2. The memory system of claim 1, wherein the first operating frequency is independent of the second operating frequency and wherein the first operating frequency is a frequency other than a multiple of the second operating frequency.

3. The memory system of claim 1, wherein the memory hub device further comprises a write data queue that receives memory write data from the external memory controller via the memory channel at the first operating frequency, wherein the memory hub controller reads the memory write data from the write data queue at the second operating frequency, and wherein receiving the write data at the first operating frequency and reading the write data at the second operating frequency implements the asynchronous boundary within the memory hub device of the memory module.

4. The memory system of claim 1, wherein the memory hub device further comprises a read data queue that transmits memory read data from the external memory controller via the memory channel at the first operating frequency, wherein the memory hub controller writes the read data to the read data queue at the second operating frequency, and wherein transmitting the read data at the first operating frequency and writing the read data at the second operating frequency implements the asynchronous boundary within the memory hub device of the memory module.

5. The memory system of claim 1, wherein the memory hub device further comprises:
    a memory device data interface, coupled to a read data queue, a write data queue, and the set of memory devices, that provides a communication path between the set of memory devices and the read data queue or the write data queue.

6. The memory system of claim 5, wherein the memory hub controller controls the transfer of data between the write data queue and the set of memory devices and the transfer of data between the set of memory devices and the read data queue.

7. The memory system of claim 1, wherein the memory hub device further comprises:
    a link interface, coupled to a memory device data interface, that provides a communication path between the memory module and the external memory controller, and wherein the memory hub controller controls the transfer of data between the memory device data interface and the link interface.

8. The memory system of claim 1, wherein the memory hub device further comprises:
    a link interface, coupled to the memory hub controller, that provides a communication path between the memory module and the external memory controller, and wherein the memory hub controller controls the transfer of the memory access command from the link interface to the set of memory devices.

9. The memory system of claim 8, wherein the memory hub controller further comprises:
    a memory device sequencer that determines a proper clock cycle to issue the memory access command to the set of memory devices.

10. The memory system of claim 9, wherein the proper clock cycle is determined based on at least one of the specification of the set of memory devices or previous memory access commands sent to the set of memory devices.

11. The memory system of claim 1, wherein the memory module is one of a dual in-line memory module (DIMM) or a single in-line memory module (SIMM).

12. The memory system of claim 1, wherein the memory module is part of a data processing device.

13. A data processing system, comprising:
    a processor; and
    a memory coupled to the processor, wherein the memory comprises one or more memory modules, each memory module comprising:
        a memory hub device integrated in the memory module;
        a set of memory devices coupled to the memory hub device, wherein the memory hub device comprises a command queue that receives a memory access command from an external memory controller via a memory channel at a first operating frequency; and
        a memory hub controller integrated in the memory hub device, wherein the memory hub controller reads the memory access command for the set of memory devices from the command queue at a second operating frequency, wherein receiving the memory access command at the first operating frequency and reading the memory access command at the second operating frequency implements an asynchronous boundary within the memory hub device of the memory module, wherein, using the asynchronous boundary, the memory channel operates at a maximum designed operating bandwidth at the first operating frequency, and wherein the second operating frequency is independently decreased in order to reduce power being consumed by the set of memory devices.

14. The data processing system of claim 13, wherein the first operating frequency is independent of the second operating frequency and wherein the first operating frequency is a frequency other than a multiple of the second operating frequency.

15. The data processing system of claim 13, wherein the memory hub device further comprises a write data queue that receives memory write data from the external memory controller via the memory channel at the first operating frequency, wherein the memory hub controller reads the memory write data from the write data queue at the second operating frequency, and wherein receiving the write data at the first operating frequency and reading the write data at the second operating frequency implements the fully asynchronous boundary within the memory hub device.

16. The data processing system of claim 13, wherein the memory hub device further comprises a read data queue that transmits memory read data from the external memory controller via the memory channel at the first operating frequency, wherein the memory hub controller writes the read data to the read data queue at the second operating frequency, and wherein transmitting the read data at the first operating frequency and writing the read data at the second operating frequency implements the fully asynchronous boundary within the memory hub device.

17. The data processing system of claim 13, wherein the memory hub device further comprises:
   a memory device data interface, coupled to a read data queue, a write data queue, and the set of memory devices, that provides a communication path between the set of memory devices and the read data queue or the write data queue.

18. The data processing system of claim 13, wherein the memory hub device further comprises:
   a link interface, coupled to a memory device data interface, that provides a communication path between the memory module and the external memory controller, and wherein the memory hub controller controls the transfer of data between the memory device data interface and the link interface.

19. The data processing system of claim 13, wherein the memory hub device further comprises:
   a link interface, coupled to the memory hub controller, that provides a communication path between the memory module and the external memory controller, and wherein the memory hub controller controls the transfer of the memory access command from the link interface to the set of memory devices.

20. A method for implementing an asynchronous boundary in a memory module, comprising:
   receiving, in a command queue of a memory hub device integrated in the memory module, a memory access command from an external memory controller via a memory channel at a first operating frequency; and
   reading, by a memory hub controller integrated in the memory hub device, the memory access command for the set of memory devices from the command queue at a second operating frequency, wherein receiving the memory access command at the first operating frequency and reading the memory access command at the second operating frequency implements the asynchronous boundary within the memory hub device of the memory module, wherein, using the asynchronous boundary, the memory channel operates at a maximum designed operating bandwidth at the first operating frequency, and wherein the second operating frequency is independently decreased in order to reduce power being consumed by the set of memory devices.

* * * * *